United States Patent
Hagen et al.

(10) Patent No.: US 9,671,624 B2
(45) Date of Patent: Jun. 6, 2017

(54) OPTICAL LENS PROCESSING SYSTEM, SUCH AS A SYSTEM FOR PROVIDING LENS DESIGN SOURCE INFORMATION TO USERS

(71) Applicant: Digital Vision, Inc., Portland, OR (US)

(72) Inventors: Douglas S. Hagen, Portland, OR (US); Gordon Keane, Portland, OR (US)

(73) Assignee: Digital Vision, Inc., Portland, OR (US)

( * ) Notice: Subject to any disclaimer, the term of this patent is extended or adjusted under 35 U.S.C. 154(b) by 425 days.

(21) Appl. No.: 14/242,755

(22) Filed: Apr. 1, 2014

(65) Prior Publication Data

US 2015/0277153 A1 Oct. 1, 2015

(51) Int. Cl.
| | |
|---|---|
| G06F 19/00 | (2011.01) |
| G02C 13/00 | (2006.01) |
| G05B 19/4097 | (2006.01) |
| G06F 17/50 | (2006.01) |

(52) U.S. Cl.
CPC ....... *G02C 13/001* (2013.01); *G05B 19/4097* (2013.01); *G05B 2219/45157* (2013.01); *G06F 17/50* (2013.01); *Y02P 90/265* (2015.11)

(58) Field of Classification Search
None
See application file for complete search history.

(56) References Cited

U.S. PATENT DOCUMENTS

| | | | |
|---|---|---|---|
| 6,142,628 A * | 11/2000 | Saigo | G02C 13/003 351/204 |
| 7,188,082 B2 | 3/2007 | Keane et al. | |
| 8,002,406 B2 | 8/2011 | Arrigotti et al. | |
| 8,340,799 B2 * | 12/2012 | Hagen | G02C 13/003 700/97 |
| 8,639,372 B2 * | 1/2014 | Hagen | G02C 13/003 700/97 |
| 2011/0297559 A1* | 12/2011 | Davis | B65B 25/008 206/5.1 |
| 2014/0016088 A1* | 1/2014 | De Rossi | G02C 7/061 351/159.42 |

* cited by examiner

*Primary Examiner* — Diem Cao
(74) *Attorney, Agent, or Firm* — Perkins Coie LLP

(57) ABSTRACT

An electronic lens processing system that tracks a lens design product used in the manufacture of a lens at a manufacturing facility is described. The system creates a work order for manufacturing the lens, where the manufacturing process can include machining a surface curvature on a lens blank by a lens grinding machine, and where the surface curvature is specified by a lens design. The system displays the work order on an electronic screen, and the work order includes the manufacturing facility's brand for the manufactured lens. A user can select the brand on the work ticket to obtain source information for the lens design used to manufacture the lens.

13 Claims, 9 Drawing Sheets

*FIG. 6*

OPTICAL LENS PROCESSING SYSTEM, SUCH AS A SYSTEM FOR PROVIDING LENS DESIGN SOURCE INFORMATION TO USERS

BACKGROUND

Digital surfacing of lens blanks is a process used to produce ophthalmic lenses, such as advanced progressive lenses. With digital surfacing, customized surface curvatures can be produced on a lens blank that is adapted to a patient's lens prescription and frame parameters. The particular surface curvatures to be machined by a lens manufacturer is based on a lens design that is created by a lens designer, and lens designs are typically given brand names by the lens designer when provided to the lens manufacturer. There is generally no physical packaging associated with the lens design.

BRIEF DESCRIPTION OF THE DRAWINGS

Examples of an electronic optical lens processing system are illustrated in the figures. The examples and figures are illustrative rather than limiting.

FIG. 2 shows an example of a prior art eyeglass lens prescription entry form.

FIG. 5A shows an example work ticket where lens processing parameters are displayed on a form.

FIG. 6 shows a portion of a work ticket showing an example of tooltips providing source information for a lens design used in the manufacture of a lens.

DETAILED DESCRIPTION

Overview

When a prescription ophthalmic lens is manufactured by machining a custom surface curvature on a lens blank, the details pertaining to the machined surface can be difficult to track at the manufacturing facility. Typically, information about the lens design used for a particular lens, such as the brand, is not readily available as there is no packaging associated with the lens design. Additionally, the lens manufacturer may market and label the manufactured lens with its own brand name so that there is no indication of the underlying lens design that was used to create the lens. The need exists for a system that allows the lens design product to be tracked. The system can be used to confirm that the correct lens design has been used for a particular lens, evaluate manufacturing problems, and train the laboratory technician or other staff at the manufacturing facility.

Described in detail below is a system that can accept an eyeglass prescription and frame parameters to create a work order for use by a laboratory technician for manufacturing prescription lenses. The system tracks a lens design product used in the manufacture of a lens at a lens manufacturing facility. The manufacturing process includes machining of a surface curvature on a lens blank by a lens grinding machine, and the surface curvature is specified by a lens design. The system displays the work order on an electronic screen, and the work order includes the manufacturing facility's brand for the manufactured lens. A user can select the brand on the work order to obtain source information for the lens design used to manufacture the lens.

Various aspects and examples of the embodiments will now be described. The following description provides specific details for a thorough understanding and enabling description of these examples. One skilled in the art will understand, however, that the embodiments may be practiced without many of these details. Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the technology. Certain terms may even be emphasized below; however, any terminology intended to be interpreted in any restricted manner will be overtly and specifically defined as such in this Detailed Description section.

Figure 1:
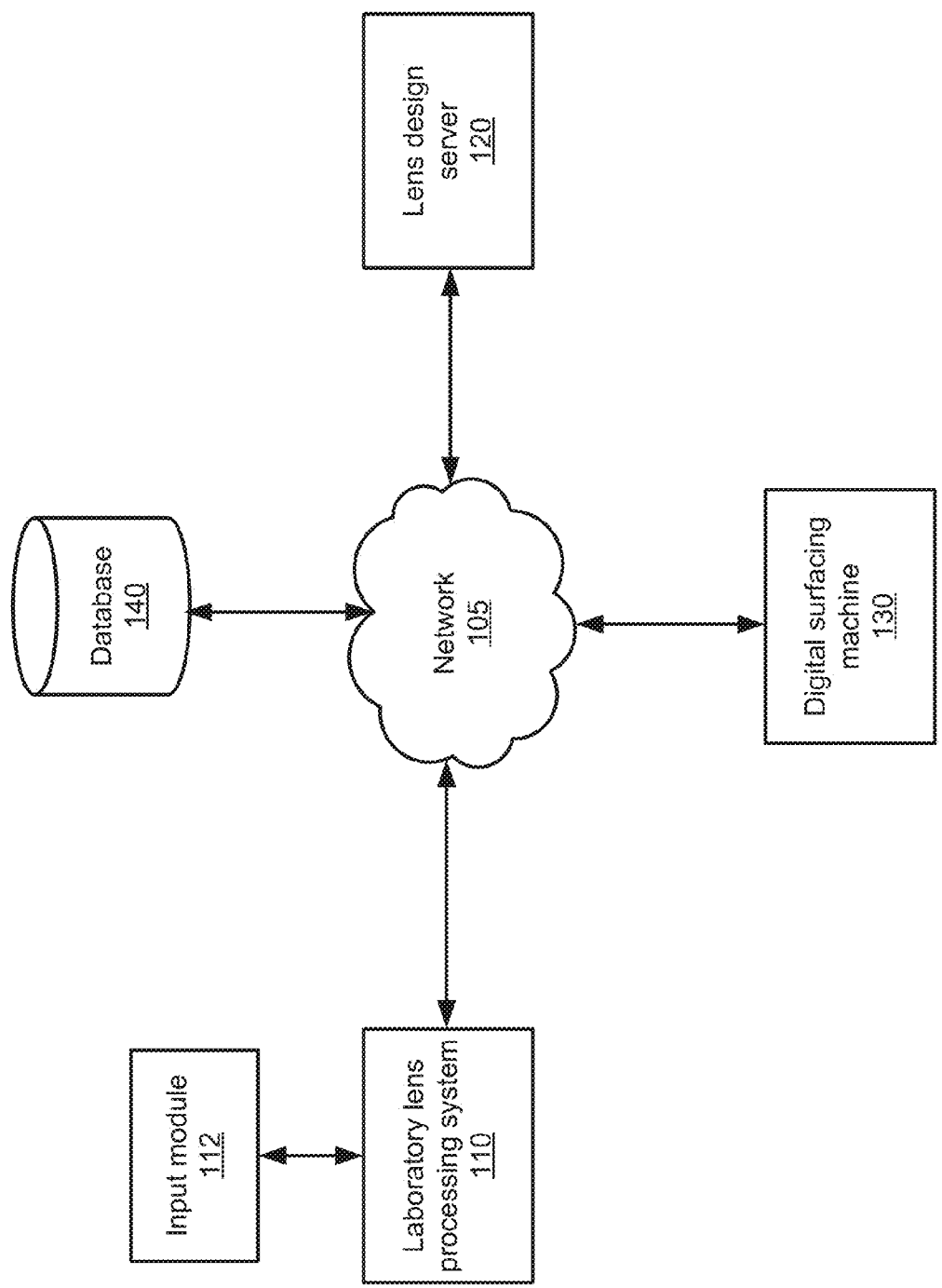
FIG. 1 shows a block diagram of an example environment in which a laboratory lens processing system tracks lens design products.

FIG. 1 shows a block diagram of an example environment in which a laboratory lens processing system 110 tracks lens design products used in the manufacture of ophthalmic lenses. The laboratory lens processing system 110 can interact with one or more lens design servers 120, one or more digital surfacing machines 130, and one or more databases 140. The lens design servers 120 calculate lens designs to meet a patient's prescription requirements; the digital surfacing machines 130 apply a specified lens design to the surface(s) of a lens blank; and the databases 140 store information about the lens designs used to manufacture lenses.

The laboratory lens processing system 110 initially receives an eyeglass prescription for a patient along with lens parameters and information about the patient's selected frames. The prescription lens information, lens parameters, and frame parameters can be entered directly into an electronic eyeglass or lens ordering system by the ECP at input module 112 and then exported to the laboratory lens processing system 110. Alternatively, the prescription can be entered manually into the laboratory lens processing system 110, for example, by data entry personnel.

Figure 2:
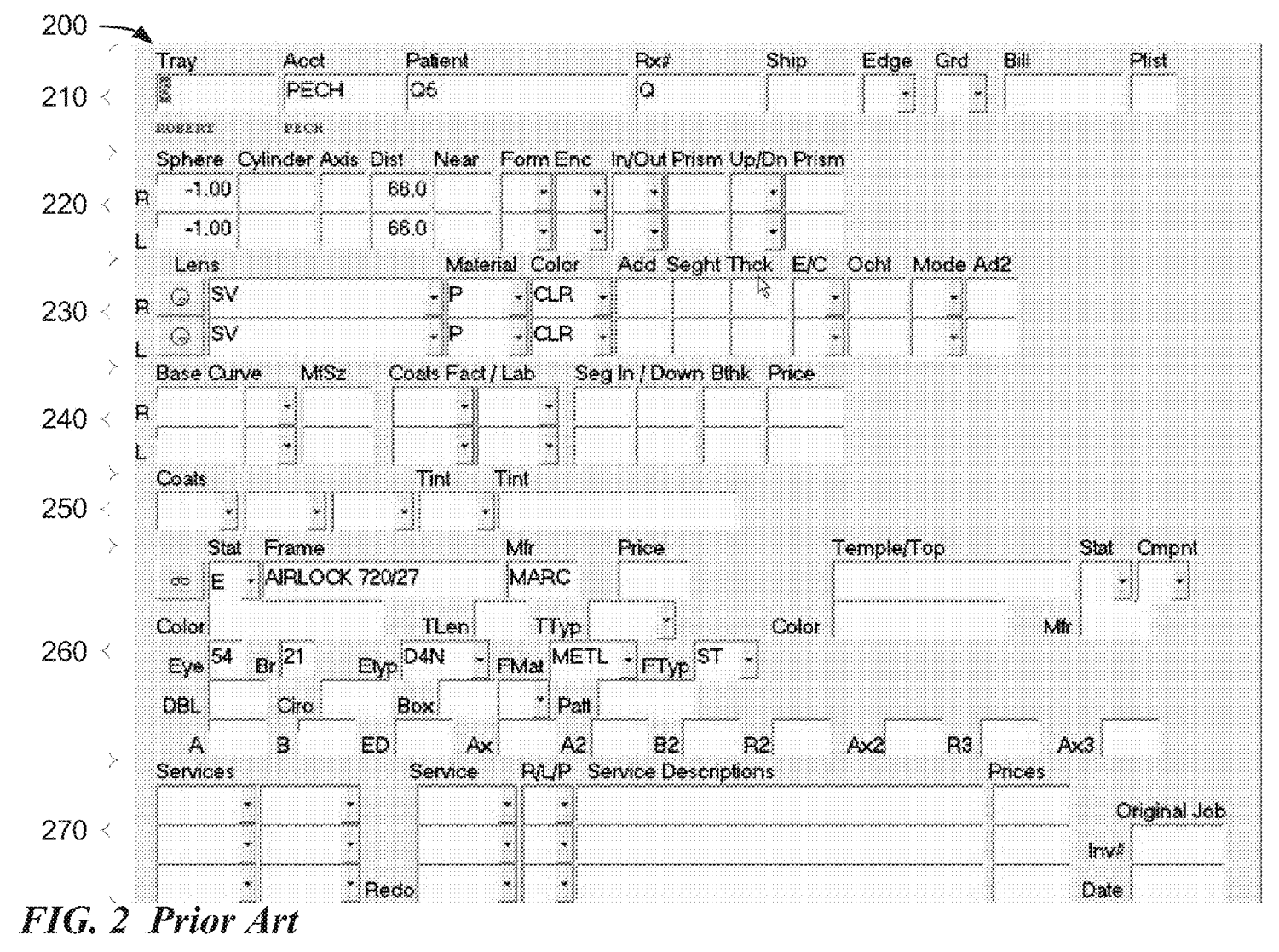

FIG. 2 shows an example of a prior art prescription lens entry form for an electronic ordering system used by an eye care professional (ECP), as described in U.S. Pat. No. 7,188,082 and is incorporated herein by reference. Information used to identify the patient and the ECP are provided in section 210. The prescription for the eyeglass lenses is entered in section 220. Prescription information includes, but is not limited to, spherical power, cylindrical power, and cylindrical axis of each lens ordered. At section 230, specific information about the lenses, for example, the style of the lens (single vision, bifocal, etc.), lens material (polycarbonate, glass, etc.) and lens color or tinting, can be specified. Further information about customizing the lenses to the patient's preferences, such as lens coatings, can be entered in sections 240 and 250. Section 260 allows the ECP to enter information about the patient's chosen frames. And section 270 provides pricing and other customized services requested by the ECP and/or the patient.

Once the prescription information is made available to the laboratory lens processing system 110, the system sends the prescription, lens parameters, and/or frame parameters to a lens design server 120. The lens parameters can include lens styling information, such as the type of lens blank to use. Then the lens design server 120 calculates a custom lens design for the patient's lens using the provided information. Typically, the lens design is generated for the ocular or back surface of the lens that will be positioned closer to the patient's eye. However, the lens design can be generated for the front surface of the lens, or lens designs can be generated for both front and back lens surfaces. In some cases, the lens design server 120 can simply be a software module that runs on the laboratory lens processing system 110, rather than a standalone server.

The calculated lens design is provided by the lens design server 120 in the form of, e.g., a point map file, also referred to as a height map file. The data in the point map file describes the curvature of the surface of the lens to be machined on a lens blank. For example, the point map file can include data for an area having a predetermined size, for example 80 mm$^2$, that has an X-coordinate for the height of the lens surface at specific Y- and Z-coordinates that correspond to locations on the surface of the lens to be machined.

The lens design and corresponding point map file generated by the lens design server 120 can be associated with a specific brand name and the lens design manufacturer. Thus, although the generated lens design and point map file have no physical packaging, they can still can be assigned a specific brand name that is associated with the lens design manufacturer. Then the lens design can be tracked to confirm that the correct lens design has been surfaced onto the lens during the manufacturing process. The point map file, the brand name, and/or the lens design manufacturer can be stored by the lens design server 120 in the database 140. The database 140 can be a centralized or distributed database. Further, access to the database 140 can be provided by a database server.

In addition to requesting the point map file from the lens design server 120, the laboratory lens processing system 110 also generates a work ticket or work order for use by a laboratory technician for manufacturing a custom pair of eyeglass lenses that meets the prescription requirements. As part of the manufacturing process, a digital surfacing machine 130 at the manufacturing facility accesses the point map file stored in the database 140 specified by the work ticket. The digital surfacing machine 130 uses the point map file to machine the surface of the lens blank.

FIG. 1 shows that communications among the laboratory lens processing system 110, the lens design servers 120, the digital surfacing machines 130, and the databases 140 are sent via a network 105, such as a local area network (LAN), a wide area network (WAN), or the Internet. However, in some instances, one or more of the laboratory lens processing system 110, the lens design servers 120, the digital surfacing machines 130, and the databases 140 can be directly coupled.

Suitable Processes and Interfaces

Figure 3A:
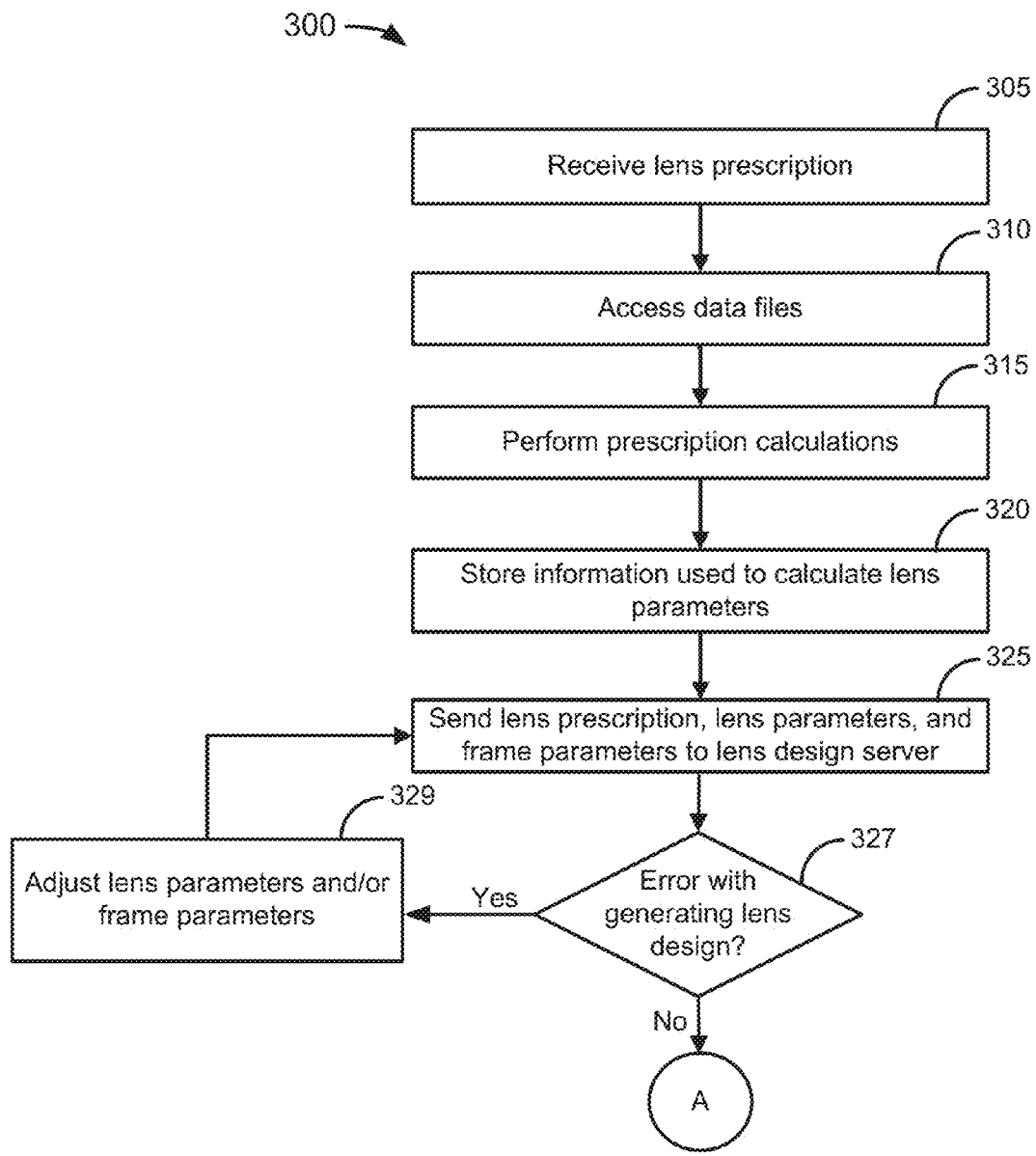
FIGS. 3A-3B is a flow chart illustrating an example method for generating a work ticket.
Figure 3B:
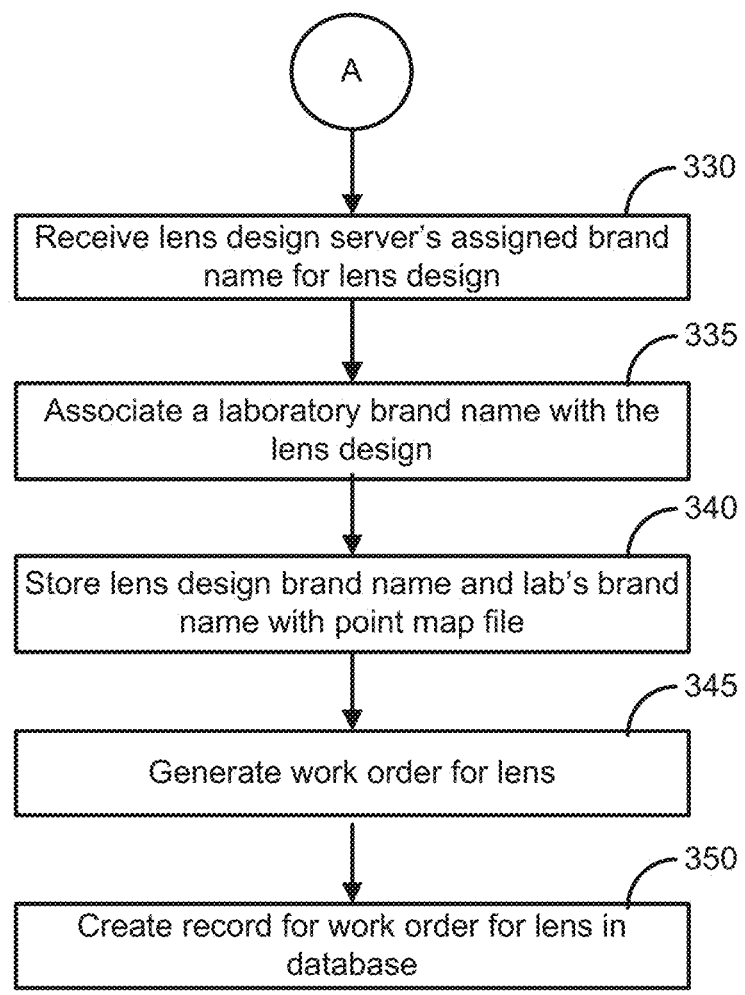

FIGS. 3A-3B is a flow chart illustrating an example of a method 300 of generating a work ticket for manufacturing a lens for an eyeglass prescription. At block 305, the laboratory lens processing (LLP) system receives a lens prescription that has been ordered by an ECP. The lens prescription can include, but is not limited to, information shown in the example prescription entry form shown in FIG. 2.

At block 310, the LLP system accesses data files to perform lens layout calculations and determine appropriate lens tool settings for manufacturing a custom lens. Examples of accessed data files include, but are not limited to, lens stock data, frame stock data, surfacing data, finishing data, and other miscellaneous data files.

Examples of lens stock data include style attributes, such as minimum fitting height for progressive lenses; material attributes, such as tintability and compatibility with various coatings; recommended lens base curve selection information for use with particular eyeglass prescriptions; lens technical information, such as lens blank dimensions and curve measurements; lens inventory in the laboratory; and lens pick lists for which manufacturer's lens blank and which lens size to use for a given prescription, ranked according to the laboratory's preferences. Examples of frame stock data includes size and color availability; whether a frame is available for requested eye, bridge, and/or temple measurements; and technical details, such as the minimum lens edge thickness and compatible lens base curve. Examples of surfacing data include setup files for the generator, i.e. surfacing machine; prism data that tells how much prism the generator is capable of producing in a generated lens; information about the dimensions of the blocks used to hold the lenses in the generator; information about the tools the generator uses to grind lenses and the pads placed on the tools, such as the diameter and curvature of the tools and thickness of the pads; and gauge data that provides the type of gauge used to measure the lens curves and thicknesses. Examples of finish data include whether a coating is compatible with a particular tint or lens material; adjustments made to the prescription to account for the way the frame fits on a patient's face; and the position and shape of drill holes. Examples of other data files include information that flags preferences or warnings that are specific to a particular account and/or doctor, such as a doctor or patient/patient group specifying an anti-reflective coating on every order.

In one example where data files need to be accessed, a lens manufacturing tool called a lap is used. The lap tool has a particular curve and is covered with abrasive pads of various types and thicknesses that grind a lens blank of a chosen material to alter the curvature of the lens blank to produce the desired lens geometry. Lap tools are available in different increments and with certain calibration values. A typical eyeglass manufacturing facility has an inventory of approximately 6000 lap tools. For each prescription, the optimum lap tools should be chosen that are most suitable for creating a lens for that prescription. Consequently, information related to the lap tools used by a particular laboratory should be accessible by the system to select appropriate tool settings during the lens processing calculations. Because the pads, the tool increments, and the way the tools are cut all impact the selection of the lap tools for a particular job, it can be beneficial for a laboratory technician to be able to access the selection information through a tooltip system (described more fully herein). The supplemental information provided through tooltips not only allows the laboratory technician to check the tool, but also to learn why the system selected certain tools and parameters for the manufacturing process.

Then at block 315, the LLP system uses the data in the files accessed at block 310 to perform a prescription calculation for generating the prescribed lens. Input information for the lens calculations include, but is not limited to, the lens prescription order information and the frame information, such as the shape of the frame, and the other data files listed above. One calculation selects the appropriate lens based upon data such as the patient's measurements, the power of the patient's prescription, and set up files for the generator for the particular laboratory. Another calculation involves calculating the cosmetics of the job based upon data such as the frame, the lens, the prescription, and calculating the thickness over the entire lens. Similarly, all of the surfacing, fining, and polishing information for a lens require calculations by the system Thus, information generated by the lens calculations include, but is not limited to, the specific lens tools to be used such as the lap tools and blocks to be used during the lens manufacturing process, calculations of the final thickness of the lens over the entire lens surface, and the work ticket calculations for surfacing and finishing the lens.

At block 320, the LLP system stores information used during the lens calculation to generate the prescribed lens. In some cases, not all of the information and calculations generated by the system during the prescription calculations need to be stored, only enough information needed to re-calculate any supplemental information needed by the lab technician when requested with tooltips, an intuitive user interface to be described below. Alternatively, the system can store all the values and parameters determined during the prescription calculations as supplemental information for display when requested through tooltips. With tooltips, a laboratory technician can access the stored information during processing of the lens as needed.

Next, at block 325, the LLP system sends the lens prescription, lens parameters, and/or frame parameters to the lens design server for calculating a customized lens surface that is optimized for the patient's data. At decision block 327, the LLP system determines whether an error has been received from the lens design server for generating the lens design. An error may be triggered if the provided lens prescription, lens parameters, and/or frame parameters are incompatible with lens designs that are provided by the lens design server, as the lens design manufacturer may have rigid specifications for the lens blank on which a particular lens design can be machined. For example, a specified lens blank thickness may not be sufficiently thick to prevent sharp edges if a calculated lens design is machined on the lens blank, as described in U.S. Pat. No. 8,002,406.

If an error message is received (block 327—Yes), at block 329, the LLP system adjusts the lens parameters and/or frame parameters, and the process returns to block 325. If no error message is received (block 327—No), the customized lens surface is calculated and stored as a point map file by the lens design server in a database accessible by a lens grinding machine in the lens manufacturing facility. A lens grinding machine can include a digital surfacing machine. Lens grinding refers to placing a surface with desired geometric characteristics on a lens blank. In some cases, lens grinding is performed by a conventional toric generator having a cutter on an arm that follows a toric path that is defined and restricted by the physical length of the cutter arm. In some cases, lens grinding is performed by a lathe that rotates the lens about an axis and moves a cutter in and out following a spiral path. A lathe can cut a digitally defined surface, as described by a surface point map file, or the lathe can cut a toric surface that is described by two simple curves crossing at 90 degrees. Thus, digital surfacing refers to a technique for machining a lens by controlling the path of a lens cutting tool using a point map file.

At block 330, the brand name for the lens design created by the lens design server is received by the LLP system from the lens design server. Other source information for the point map file can also be sent by the lens design server, for example, the name of the lens design manufacturer; contact information for the manufacturer; a website for the manufacturer; links to a website for the manufacturer; links to logos, icons, or digital images for the manufacturer and/or brand; stylized scripts and/or fonts; and links to advertising campaigns.

Next, at block 335, the LLP system associates a laboratory brand name for the lens to be manufactured with the point map file of the created lens design. And at block 340, the LLP system stores in a database the laboratory brand name along with source information for the point map file, for example, the brand name for the lens design, the lens design manufacturer, and information sent to the lens design server 120 for generating the lens design, such as the type of lens blank to be used for machining the surface curvature described by the point map file. By associating the laboratory brand name with the source information for the point map file in a database, the LLP system can look up tracking information as to which lens design was used to manufacture a specific lens and other provided information regarding the use of the point map file.

Then at block 345, the LLP system generates the work order for the prescription lens. In addition to the processing steps for manufacturing the lens, the work order includes the laboratory brand for the lens to be manufactured. The work order can have the format of a form, for example the form 500A shown below in FIG. 5A. Additionally or alternatively, the work order can have a graphical format, for example the graphic 500B shown below in FIG. 5B. The graphic is a picture of the lens or lenses 550, 552 to be manufactured superimposed on the lens blank 555, 557 to be used.

At block 350, the LLP system creates a record for the work order for the lens in the database. The work order can then be printed by a laboratory technician for use during the manufacturing process of the lens, accessed using an electronic display, and/or accessed by the digital surfacing machine to determine the appropriate point map file stored in the database to use for machining the lens.

Figure 4:
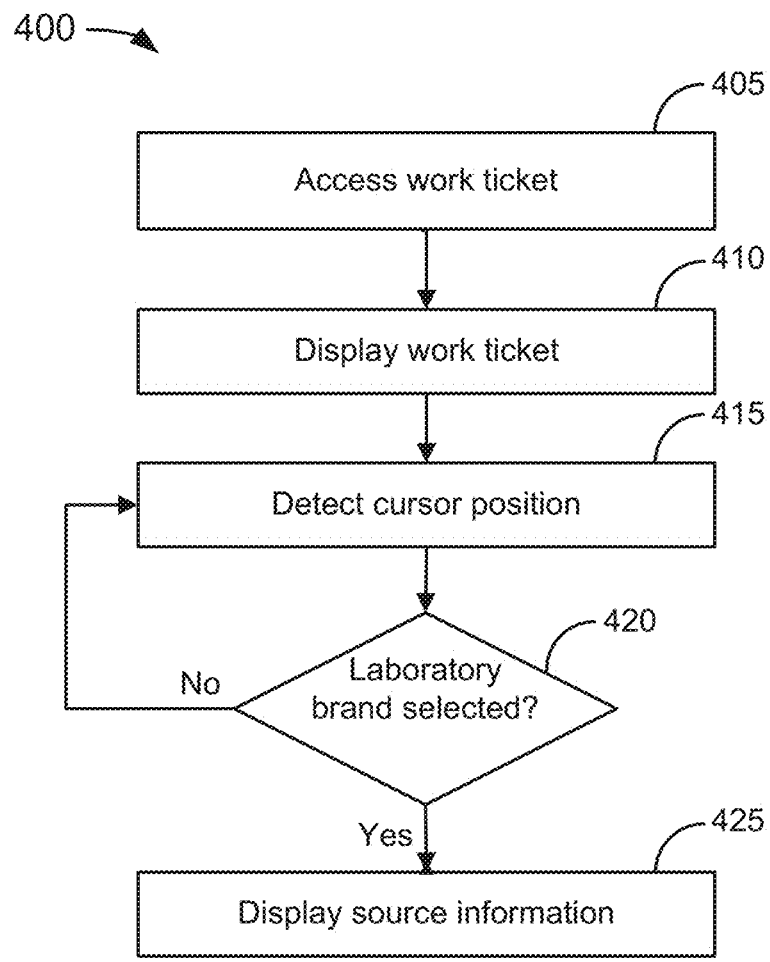
FIG. 4 is a flow chart illustrating an example method for displaying source information for a lens design used in manufacturing a lens.

FIG. 4 is a flow chart illustrating an example of a method 400 of displaying source information for a lens design used in manufacturing a lens. A tooltip graphical user interface (GUI) element is employed with this method.

At block 405, the system accesses the work ticket generated at block 345 of FIG. 3B. The system accessing the work ticket at block 405 may or may not be the same as the system that generated the work ticket. The system then displays the work ticket on an electronic screen at block 410.

The electronic screen should be remotely accessible by a user through the use of an input device, such as a mouse, to move a cursor over the work ticket displayed on the screen. The user selects elements of interest from the work ticket to obtain additional information. For example, the user can select the laboratory brand name for the lens to be manufactured to obtain source information for the lens design used for manufacturing the lens. Of course, the system may use a touch screen interface, voice input, or other input technologies.

Movements of the cursor made by the user on the display are detected by the system at block 415. Then at decision block 420, the system determines whether the laboratory brand for the lens has been selected by the user. A user can select the laboratory brand or any other element on the work ticket by moving the cursor on or near the element. If the cursor has not been moved or has not been moved on or near the laboratory brand (block 420—No), the process returns to block 415 to detect cursor movement.

Figure 6:
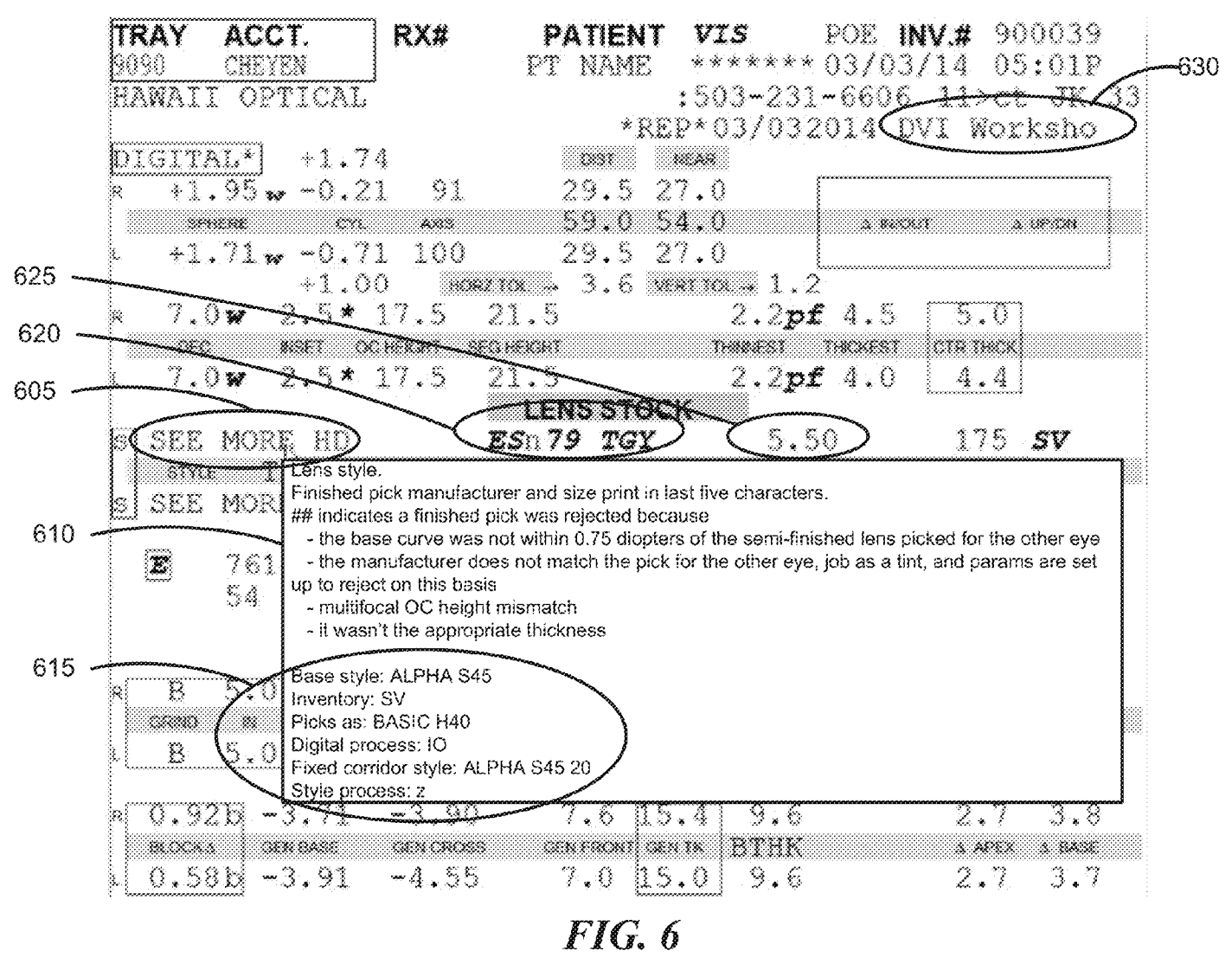

If the cursor has been moved on or near the laboratory brand on the work ticket (block 420—Yes), at block 425, the system accesses the database to determine the source information for the lens design used for manufacturing the lens and displaying the source information along with any other relevant parameters sent to the lens design server for generating the lens design, such as the type of lens blank for which the lens design should be designed. The accessed information may be displayed in a pop-up window that overlaps the displayed work ticket, such as shown in the example of FIG. 6. Other ways of displaying the source information may also be used, such as displaying the information in a fixed status bar on the screen.

Figure 5A:
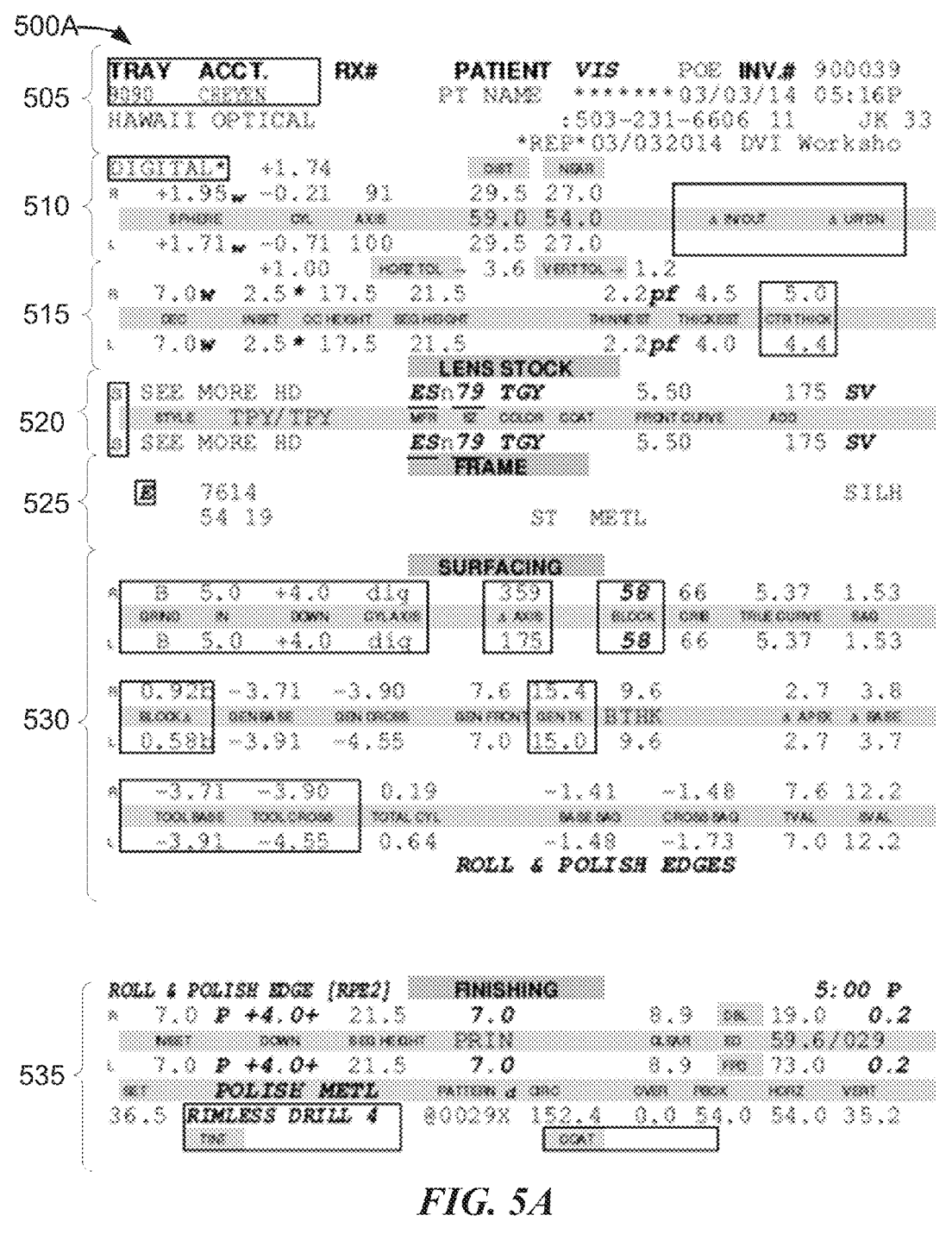

FIG. 5A is an example work ticket where lens manufacturing instructions and parameters are displayed on a form 500A. The work ticket has several sections. The identification and contact information for the patient and/or the ECP are displayed in section 505, and the lens prescription information provided by the ECP is shown in section 510.

The lens information that describes the parts to be selected from inventory for manufacturing the lens are shown in section 520. Lens information includes the lens blank manufacturer, size of the lens blank, whether the required lens blank type is stocked, and the type of lens blank, for example, single vision, progressive, plastic, high index, polycarbonate, coated, or uncoated. The frame information for the eyeglasses is shown in section 525, for example, the style, color, and manufacturer, and whether the frame has a rim or is rimless.

Information relating to surfacing of the lens is displayed in section 530. The first line in section 530 provides information for laying the lens out for blocking and applying the block. The second line in section 530 provides information on how to set the generator, including the amount of prism needed, the base curve which creates the spherical power of the lens, and the cross curve which creates the cylindrical or astigmatic power of the lens. Prism can be induced in lenses for many reasons, for example, if the doctor prescribes a prism to be placed in front of the patient's optical center, by tilting the lens and inducing a prism, the optical center can be moved around on the lens. Sometimes the laboratory equipment requires that the prism is created at the blocker by tilting the holding device, other times the machine that cuts the curves on the back of the lens offsets and creates the prism. Also, a laboratory might have a different piece of equipment for processing a polycarbonate lens than for processing a glass lens or lens made of another material. Thus, the tooltip allows a laboratory technician to select the prism entry on the work ticket to see how the equipment is set up for a particular lens manufacturing job without having to reference a setup file that changes for different lenses.

The base and cross curves specified in the second line in section 530 are the curves to be cut into the lens by the generator. The third line in section 530 provides information on the tools used to produce the base and cross curves. The set of tool curves specifies the lap tools that are used to polish out the curves that are cut by the generator. Essentially, pads made of sandpaper are used to remove the rough marks of the machines that cut the curves and to produce an optical quality surface. Consequently, there is a difference between the first set of machine tool curves specified in the second line and the second set of surface curves specified in the third line that are created by the tool.

The surfacing information given in the second line of section 530 further includes the settings for the grinding machine that selects the thickness of the lens to be ground. The information in the second line provides the thickness of the blank and further shows calculational caliper checks that can be used to determine whether the edge of the surfaced lens has the correct thickness. Because different machines have different setup methods and different thickness settings that are particular to the type of generator being used by the laboratory, the tooltip can conveniently show a setting value that is different from the actual final thickness of the lens to be produced.

Further, the third line of section 530 provides base sag and cross sag parameters that are used by gauge measuring tools to ensure that the curves are cut the way the system calculates that the curves should be cut. A user can access the information using the tooltip by moving a cursor over the appropriate work ticket element, causing the information to be displayed. Thus, if the machine setting is not needed by the user, the additional information does not clutter up the work ticket.

Surfacing information can also include the technical details required to produce the appropriate curves on the selected lens blank, for example, the layout method, the reference point for the particular lens style, the lap tool precision and the lap tool pad thickness used in the lens calculation. These parameters are used by the laboratory technician to produce the lens and to check that the correct machines in the laboratory are used to produce the appropriate lens prescription. Thus, the tooltip can be used for proofing operations and for setting up a new piece of equipment in the laboratory.

Information relating to finishing of the lenses is displayed in section 535. The finishing information includes, but is not limited to, rolling the edges of the lens, polishing the lens, coating the lens, and tinting the lens.

For prescriptions that specify rimless frames, information on drilling of holes in the lens is needed. The holes have certain geometric requirements because a lens must have a minimum thickness to hold the mounting apparatus for the frame. The lens also has a maximum thickness imposed by the drilling equipment. Thus, the tooltip can provide information on drill-hole thicknesses in the lens. If the drill-hole thickness is not within an acceptable range, the prescription can be flagged as a problem. The drill-hole thickness information can be visualized using the tooltip functionality with the graphical work ticket described below in FIG. 5B.

Figure 5B:
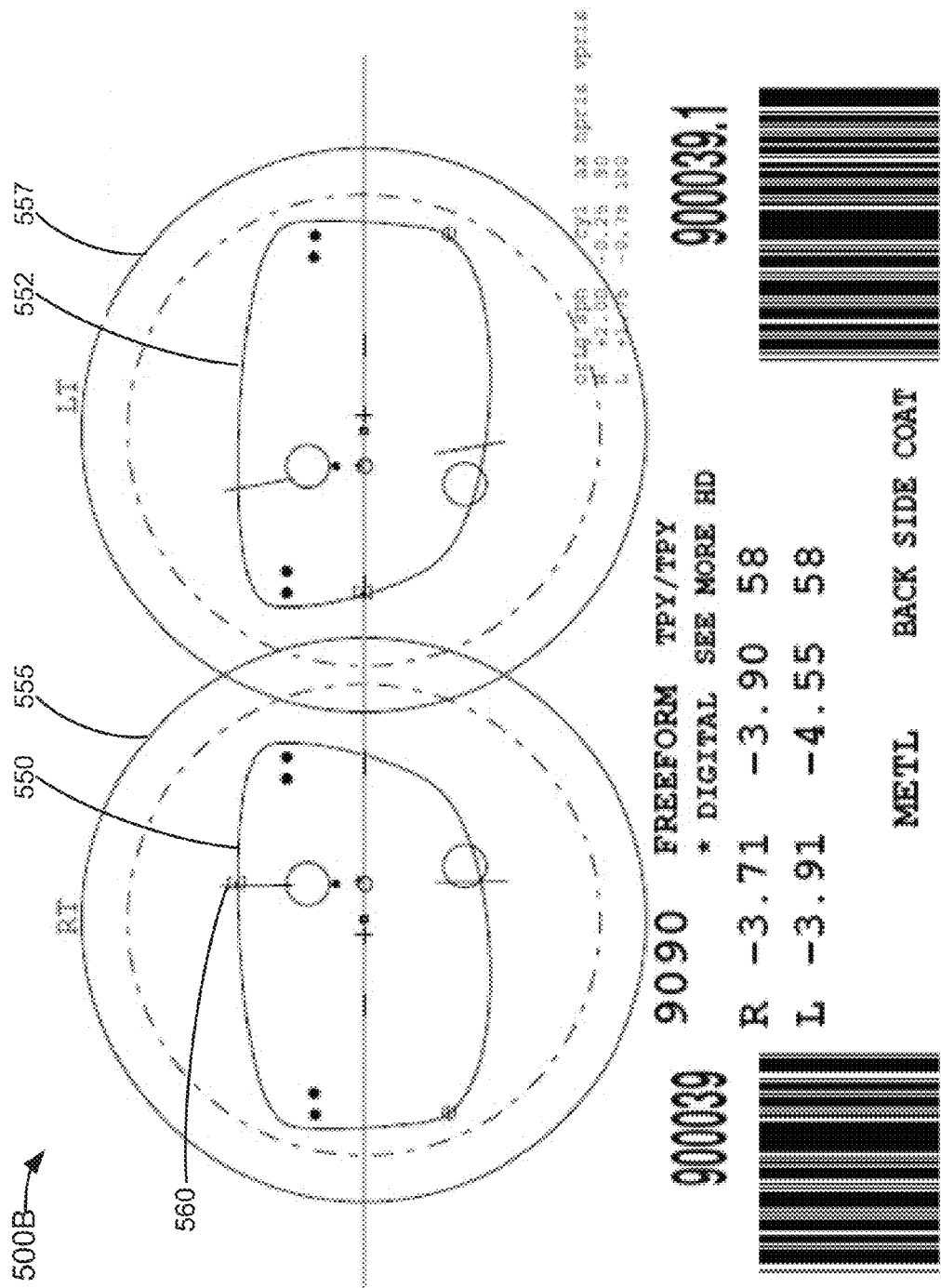
FIG. 5B shows an example work ticket showing lens processing parameters displayed in a graphical format.

FIG. 5B is an example work ticket showing cosmetic information about the lens manufacturing parameters displayed in a graphical format 500B. The work ticket graphic 500B shows the patient's right lens 550 on the left and the patient's left lens 552 on the right, the way the patient's lenses would be seen on the patient's face. The lenses are superimposed on images of the starting round lens blanks 555, 557 from which the lenses will be manufactured.

Also shown in the graphic 500B are some markings used by lens blank manufacturers. Because different lens blank manufacturers use different markings, it would be helpful for the lens technician to have a readily accessible definition of the markings available through the use of tooltips. Thus, if the technician making the lens points a cursor at one of the markings, the system can be programmed to display the meaning of the marking in a tooltip and any specific effects the marking will have on the lens being manufactured. For example, the letter "E" marking 560 as shown in FIG. 5B identifies the thickest point on the periphery of the lens to be manufactured. The optimum thickness of the lens at a specific point selected by the cursor can also be displayed in a tooltip to aid the technician in manufacturing the lens.

Tool information for producing the lenses are displayed in section 560 below the graphics of the lenses. Similar tooltip information is available as when hovering over the information in section 530 of the example work ticket form in FIG. 5A.

FIG. 6 shows a portion of a work ticket showing an example of tooltips providing source information for a lens design used in the manufacture of a lens.

In the example of FIG. 6, element 630 is the name of the laboratory, DVI Workshop, at which the lens is manufactured. Element 605 on the work ticket is the laboratory brand, "See More HD," assigned to the lens to be manufactured according to the process specified in the work ticket. The lens is also marketed under the "See More HD" brand. When the user uses tooltips and moves the cursor on or near element 605, the window 610 appears.

Within the window 610, source information for the lens design is provided, as indicated by element 615 in the lower half of the window 610. The first line of element 615 identifies the brand of the base style used by the lens design. In this case, the lens design brand is "ALPHA S45." The second line identifies the inventory, or the type of lens blank on which the lens design is designed to be machined. In this case, the inventory is "SV" which indicates that a single vision lens should be used, that is, a standard spherical front lens with no bifocal. The third line of element 615, pick style, provides the name of the lens style that controls the availability of base curve, add power, and material combinations. Many lens styles share the same availability ranges so the identification of a lens style having a given set of availability ranges can be stored in a database and used as a reference for other lens styles having the same availability ranges. The fourth line of element 615 identifies the manufacturer of the lens design process. In this case, the design manufacturer is IO, a shorthand notation for IOT (Indizen Optical Technologies). The fifth line of element 615 indicates that the lens design is for a variable corridor lens, and a ALPHA S45 20 brand is identified within the ALPHA S45 group. Finally, the bottom line of element 615 identifies the style process which describes the geometric characteristics of how the lens works. In some cases, the tooltips window can provide other information, such as contact information for the manufacturer, a website for the manufacturer, and alternative lens design brands that may be suitable, where the alternatives are available from either the same manufacturer or different manufacturers.

A user viewing the example work ticket of FIG. 6 sees the manufactured lens brand, See More HD, in element 605. The user also sees that the lens blank on which the lens design is to be machined is made by manufacturer ES and has a size of 79, as shown in element 620, while the front curve of the lens blank is 5.50 as shown in element 625. A person not familiar with the lens manufacturing process may think that the See More HDES79550 lens can be selected as a packaged unit from a shelf. However, "See More HD" is the name of the lens machined using a single vision lens blank, and a progressive lens is created during the machining process on the ocular side of the lens blank. It is the machining of the lens design on the surface of the lens blank that transforms the lens blank into a lens that meets the customer's prescription and frame requirements.

Additionally, a lens manufacturing laboratory may employ lens design products from many different lens design manufacturers to provide a large variety of custom ophthalmic lenses to its customers. However, the brand that is visible on the work ticket is the laboratory brand for the finished manufactured lens. Because the laboratory in this case, DVI Workshop, markets the manufactured lens under its own brand name, See More HD, if the source information in element 615 were not available via tooltips, it would be difficult to identify the particular brand and manufacturer of the lens design used to manufacture the lens. Thus, tooltips provides a way to track lens design products used in the lens manufacturing process. As a result, tooltips is useful for confirming that the correct lens design has been used in the lens manufacturing process, for diagnosing manufacturing problems, and also for training staff at the manufacturing facility about the lens manufacturing process.

Suitable Systems

Figure 7:
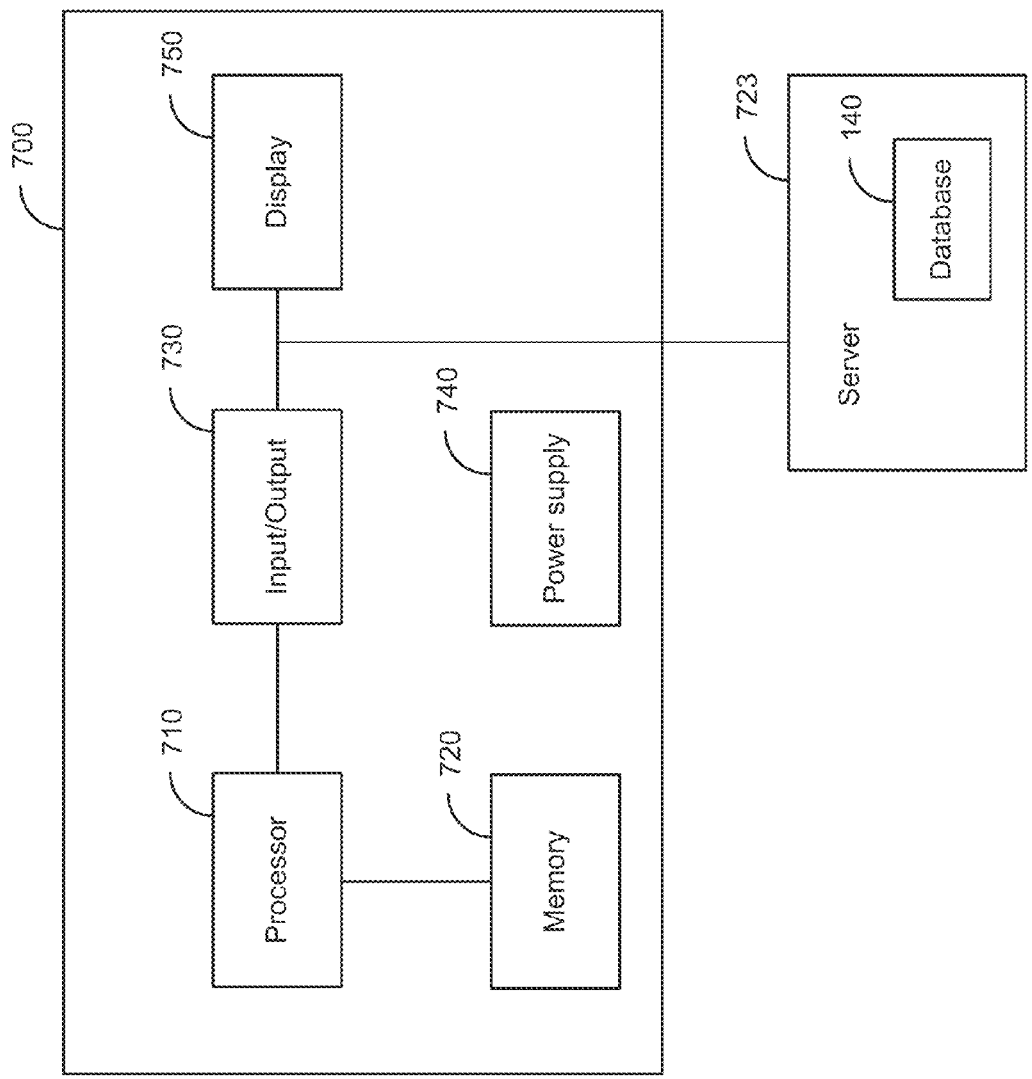
FIG. 7 depicts a block diagram illustrating an example of a user interface system that displays source information for a lens design for a lens manufacturing work ticket.

FIG. 7 depicts a block diagram illustrating an example of an LLP system 700 that displays source information through the use of tooltips for a lens design that is used in manufacturing a lens. The LLP system 700 can include one or more processors 710, memory units 720, input/output devices 730, power supplies 740, and displays 750. In some embodiments, the LLP system 700 can access a server 723 that has one or more databases 140. Alternatively, the LLP system 700 can include the server 723 and databases 140.

A processor 710 can be used to control the LLP system 700. Memory units 720 include, but are not limited to, RAM, ROM, and any combination of volatile and non-volatile memory. Input/output devices 730 can include, but are not limited to, triggers to start and stop the LLP system 700, visual displays, speakers, and communication devices that operate through wired or wireless communications, such as a mouse for controlling a cursor. In some embodiments, the input/output device 730 can communicate with the server 723 that has one or more databases 140. The server 723 provides access to data stored in the database 140, such as source information for lens designs to be displayed using tooltips, and other additional information.

A power supply 740 can include, but is not limited to, a battery. A display 750 can include, but is not limited to, an electronic display, and can be a touchscreen display.

Conclusion

Unless the context clearly requires otherwise, throughout the description and the claims, the words "comprise," "comprising," and the like are to be construed in an inclusive sense (i.e., to say, in the sense of "including, but not limited to"), as opposed to an exclusive or exhaustive sense. As used herein, the terms "connected," "coupled," or any variant thereof means any connection or coupling, either direct or indirect, between two or more elements. Such a coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the embodiments is not intended to be exhaustive or to limit the embodiments to the precise form disclosed above. While specific examples for the embodiments are described above for illustrative purposes, various equivalent modifications are possible within the scope of the embodiments, as those skilled in the relevant art will recognize. For example, while lenses for eyeglasses are mentioned, any type of lens may be processed under the principles disclosed herein. While processes or blocks are presented in a given order in this application, alternative implementations may perform routines having steps performed in a different order, or employ systems having blocks in a different order. Some processes or blocks may be deleted, moved, added, subdivided, combined, and/or modified to provide alternative or subcombinations. Also, while processes or blocks are at times shown as being performed in series, these processes or blocks may instead be performed or implemented in parallel, or may be performed at different times. Further any specific numbers noted herein are only examples. It is understood that alternative implementations may employ differing values or ranges.

The various illustrations and teachings provided herein can also be applied to systems other than the system described above. The elements and acts of the various examples described above can be combined to provide further implementations of the embodiments.

Any patents and applications and other references noted above, including any that may be listed in accompanying filing papers, are incorporated herein by reference. Aspects of the embodiments can be modified, if necessary, to employ the systems, functions, and concepts included in such references to provide further implementations of the embodiments.

These and other changes can be made to the embodiments in light of the above Detailed Description. While the above description describes certain examples of the embodiments, and describes the best mode contemplated, no matter how detailed the above appears in text, the embodiments can be practiced in many ways. Details of the system may vary considerably in its specific implementation, while still being encompassed by the embodiments disclosed herein. As noted above, particular terminology used when describing certain features or aspects of the embodiments should not be taken to imply that the terminology is being redefined herein to be restricted to any specific characteristics, features, or aspects of the embodiments with which that terminology is associated. In general, the terms used in the following claims should not be construed to limit the embodiments to the specific examples disclosed in the specification, unless the above Detailed Description section explicitly defines such terms. Accordingly, the actual scope of the embodiments encompasses not only the disclosed examples, but also all equivalent ways of practicing or implementing the embodiments under the claims.

While certain aspects of the embodiments are presented below in certain claim forms, the applicant contemplates the various aspects of the embodiments in any number of claim forms. For example, while only one aspect of the embodiments is recited as a means-plus-function claim under 35 U.S.C. §112, sixth paragraph, other aspects may likewise be embodied as a means-plus-function claim, or in other forms, such as being embodied in a computer-readable medium. (Any claims intended to be treated under 35 U.S.C. §112, ¶6 will begin with the words "means for.") Accordingly, the applicant reserves the right to add additional claims after filing the application to pursue such additional claim forms for other aspects of the embodiments.

We claim:

1. An electronic lens processing system to facilitate the manufacture of lenses at a laboratory, comprising:
    a display;
    at least one memory component storing a software program and data structure,
        wherein the data structure includes a relationship between a laboratory brand for a lens and a designer brand for a lens design,
        wherein the lens design is to be machined on a lens blank with a lens grinding machine to manufacture the lens;
    at least one input/output device;
    a processor coupled among the display, the at least one memory component, and the input/output device,
        wherein the processor is configured to execute the software program, the software program comprising:
            a first module operable to store the relationship between the laboratory brand and the designer brand, and to generate a work ticket, based at least upon a received lens order for the lens,
                wherein the work ticket includes information pertaining to processing steps for operating the lens grinding machine, and the laboratory brand for the lens;
            a second module operable to show on the display at least a portion of the work ticket that includes the laboratory brand for the lens, and to receive information regarding a position of a cursor movable by a user or an input by the user; and
            a third module operable to provide information about the relationship between the laboratory brand and the designer brand on the display when a position of the cursor or the input by the user is located near the laboratory brand on the display.

2. The electronic lens processing system of claim 1, wherein the information about the relationship includes a designer brand of the lens design.

3. The electronic lens processing system of claim 1, wherein the information about the relationship includes a manufacturer of the lens design.

4. The electronic lens processing system of claim 1, wherein the information about the relationship includes a type of lens blank to be used with the lens design.

5. The electronic lens processing system of claim 1, wherein the information about the relationship includes geometric characteristics describing how the lens works.

6. A computer-implemented method comprising:
    receiving a prescription for a lens and parameters for the lens at a lens manufacturing facility;
    requesting a point map file for a surface of the lens based on the prescription and the parameters, wherein the point map file has a first brand;
    generating a work order for manufacturing the lens from a lens blank using the point map file,
        wherein the work order includes a second brand for the manufactured lens and does not include the first brand, and
        further wherein the second brand is distinct from the first brand;
    storing information relating the second brand to the first brand;
    displaying at least a portion of the work order that includes the second brand on an electronic screen;
    upon selection by a user of the second brand on the work order displayed on the electronic screen, displaying the information relating the second brand to the first brand.

7. The computer-implemented method of claim 6, wherein the information relating the second brand to the first brand includes the first brand of the point map file used to manufacture the lens.

8. The computer-implemented method of claim 6, wherein the information relating the second brand to the first brand includes a type of lens blank on which a surface curvature described by the point map file is machined.

9. The computer-implemented method of claim 6, wherein the information relating the second brand to the first brand includes a manufacturer of the point map file.

10. The computer-implemented method of claim 6, wherein the point map file is requested from a lens design server.

11. The computer-implemented method of claim 6, further comprising accessing the point map file by a digital surfacing machine at the lens manufacturing facility, wherein the digital surfacing machine machines the surface of the lens blank based on the point map file.

12. The computer-implemented method of claim 6, further comprising:
   upon receiving an error for the requested point map file, adjusting the parameters for the lens and re-requesting the point map file for the surface of the lens based on the prescription and the adjusted parameters.

13. The computer-implemented method of claim 6, wherein the parameters for the lens includes frame parameters.

* * * * *